United States Patent
Ueda et al.

(10) Patent No.: US 7,648,041 B2
(45) Date of Patent: Jan. 19, 2010

(54) GASKET FOR PRECISION-PACKAGING SUBSTRATE CONTAINER

(75) Inventors: Shigeaki Ueda, Higashiosaka (JP); Yasuyuki Watanabe, Hikari (JP)

(73) Assignee: Kabushiki Kaisha Daihachikasei, Osaka (JP)

( * ) Notice: Subject to any disclaimer, the term of this patent is extended or adjusted under 35 U.S.C. 154(b) by 563 days.

(21) Appl. No.: 11/379,578

(22) Filed: Apr. 21, 2006

(65) Prior Publication Data

US 2006/0249512 A1    Nov. 9, 2006

(30) Foreign Application Priority Data

Apr. 22, 2005    (JP) .............................. 2005-124448

(51) Int. Cl.
- B65D 53/02    (2006.01)
- B65D 85/30    (2006.01)
- B65D 85/86    (2006.01)

(52) U.S. Cl. ........................ 220/378; 206/710; 220/323; 277/644

(58) Field of Classification Search ................. 220/378, 220/310.1, 806, 323; 206/710, 711; 277/644
See application file for complete search history.

(56) References Cited

U.S. PATENT DOCUMENTS

| | | | | |
|---|---|---|---|---|
| 2,529,098 A | * | 11/1950 | Noll ............................ | 277/626 |
| 2,593,712 A | * | 4/1952 | Wells et al. ................. | 220/86.1 |
| 2,602,563 A | * | 7/1952 | Lipski ....................... | 220/23.87 |
| 2,886,205 A | * | 5/1959 | Gerry .......................... | 220/378 |
| 3,334,774 A | * | 8/1967 | Poltorak ...................... | 220/378 |
| 3,459,325 A | * | 8/1969 | Jezussek et al. ............. | 220/378 |
| 3,813,904 A | * | 6/1974 | Wallskog ..................... | 70/169 |
| 4,349,206 A | * | 9/1982 | Simm et al. ................. | 277/612 |
| 5,865,336 A | * | 2/1999 | Krzywdziak et al. ........ | 220/324 |
| 6,364,152 B1 | * | 4/2002 | Poslinski et al. ............ | 220/788 |
| 6,761,360 B2 | * | 7/2004 | Hammi ....................... | 277/630 |
| 7,243,816 B2 | * | 7/2007 | Aochi ......................... | 220/829 |
| 2002/0195455 A1 | * | 12/2002 | Takahashi et al. ........... | 220/806 |

* cited by examiner

*Primary Examiner*—Anthony Stashick
*Assistant Examiner*—Niki M Eloshway
(74) *Attorney, Agent, or Firm*—Judge Patent Associates

(57) ABSTRACT

A uniquely shaped gasket (6) suitable for a container for storage of substrate plates requiring precision packaging. When such plates are stored into a container body (2), and a container lid (3) is closed and then a lid lock is applied, a gasket's outward ledge (6b, 6c, 6d) is pressed downward by an outward adjacent surface (3f) and deformed; consequently, the end of the ledge's tip (6d) will extend to fall in a seal channel (2d), in other words, to abut on a sectionally downward concave (2d), wherein the gasket (6) still keeps its elastic resiliency. As a result, if an air pressure difference occurs, the tip end (6d) will shift its abutting point. While the tip end (6d) moves, a minimum gap between the tip end (6d) and the channel surface (2d) occurs, and this gap will act as ventilation route to equalize the air pressure difference.

5 Claims, 4 Drawing Sheets

GASKET FOR PRECISION-PACKAGING SUBSTRATE CONTAINER

BACKGROUND OF THE INVENTION

1. Technical Field

The present invention relates to a container utilized, for example, for containing, storing, and transporting a great number of thin plates such as semiconductor wafers or liquid-crystal glass plates, and more particularly to the structure of a gasket that enables the inner pressure of the container to accommodate fluctuation in pressure conditions. PCT Patent Publication WO 2004/035423 entitled "Storage Container for Receiving Precision Substrates such as Wafers" is incorporated into this specification by reference.

2. Description of the Related Art

Because ultramicroscopic processing is to be applied to the surfaces of substrates (thin plates), such as semiconductor wafers, that require precision packaging, extremely high-level cleanliness is required to store, transport, and contain the substrates; therefore, extremely airtight substrate containers are utilized. However, when, for example, an extremely airtight container is carried by airplane, as the altitude increases, a difference between the atmospheric pressure and the inner container air pressure occurs, whereby the container expands and the inner container gas is released for awhile; then, on the ground, the inner container air pressure is low compared with the atmospheric pressure, causing the container to contract. With the container contracted, it is very difficult to open the lid; if the lid is forced open, the atmospheric air abruptly enters the container and a drawback occurs, causing dust in the atmospheric air to contaminate the substrates.

A wafer container is disclosed that employs a configuration in which, in order to address the difference between the atmospheric pressure and the inner container air pressure, a molecular separation filter is mounted in a port provided in the sidewall of the container body or the lid (Japanese Utility Model Application No. 1990-49721 (FIG. 1)). It is argued that, with the wafer container, because the air is discharged from or flows into the container through the molecular separation filter in response to the fluctuation in the atmospheric pressure, opening and closing the lid is readily carried out. However, measures using a shielding plate M that is annexed opposite the inner side of the molecular separation filter F are also disclosed, in order to address a problem that, under the atmospheric pressure fluctuation that occurs while the container is transported as airborne freight, the air is discharged from or flows into the container through the molecular separation filter, causing dust in the atmospheric air (the air within the cargo compartment of the airplane) to adhere to the filter and causing particles that have passed through the filter to adhere to the surface of substrates contained on the opposite side of the filter (Japanese Laid-Open Patent Publication No. 1998-107135 (FIG. 3)). In addition to this problem, the fact that the molecular separation filter requires cleaning prior to each air flight has posed a problem in terms of economic efficiency and usefulness.

Meanwhile, a structure is disclosed in which a gasket is formed of a fluorine-system resin or an olefin-system resin that is an open-cell foamed material made up of continuous pores, and that is mounted interposed between a container body for precision packaging of substrates, such as semiconductor wafers, and the lid (Japanese Patent Application Laid-Open No. 2003-170969, paragraph 0021). It is argued that the foregoing gasket facilitates ventilation through the pores and the inner container air pressure can always be maintained at the same level as the atmospheric pressure, regardless of change in the atmospheric pressure.

The gasket made up of the open-cell foamed material is adapted to make the pores trap dust in the atmospheric air; therefore, small-diameter dust passes through the pores, but large-diameter dust is trapped in the pores. Accordingly, the formation of the gasket requires strict management of the pore diameter and adjustment and has a limited number of uses, thereby being expensive.

BRIEF SUMMARY OF THE INVENTION

As described above, the container with the molecular separation filter annexed thereto, or using the gasket made up of the foamed resin, is characterized by rapidly responding to fluctuations in air pressure and implementing discharge and intake of the air; however, large air pressure differences occur mainly in the cargo compartment of an airplane, and even if the container is wrapped in a plastic film or the like, intake of the air under this environment causes particles in the air to adhere to the filter or the air-permeable gasket, thereby contaminating these items. In this situation, because it is difficult to clean out the particles that have adhered to the small pores, the filters or the gaskets are changed for every flight; therefore, they lack economic efficiency.

In addition, as described above, in the case of a precision-packaging substrate container with a highly airtight gasket attached interposed between the container body and the lid, expansion or contraction of the gasket due to the differences during airborne freight between the atmospheric pressure and the inner container air pressure makes it difficult to detach the lid. The present invention addresses the necessity of equalizing the air pressure difference by using the difference between the inner container air pressure and the atmospheric pressure, caused by the fluctuation in the atmospheric pressure, to make the sealing side of a gasket mounted around the container mouth travel in a sliding fashion and by implementing discharge and intake of the air through microscopic gaps to be produced at the sliding surface, thereby achieving particle-free air ventilation.

A first aspect of this invention is to provide a container (1) which comprises a container body (2), a container lid (3), a cassette for storage of a plurality of substrate plates requiring precision packaging in air-tight conditions, placed in the cassette in substantially equally-spaced status. The container further comprises a gasket (6) for performing adjustable seals for the air tight container (1) in conjunction with the container body (2) and its lid (3). The gasket (6) has an elastic body looping along a periphery of the lid (3) and having a section of a generally two-ledged wall (6a, 6b, 6c, 6d, 6e), comprising a shorter inward ledge (6e) and an outward ledge (6b) forming bent hook (6c, 6d, 6g). The gasket (6) is mounted under a lid plate (3ab) of the lid (3) and above a flat area (2c) inside the container body (2), the flat area (2c) being provided with a channel (2d) for the hook end (6d) to abut therewith. When the lid (3) has been closed over the container body (2), the gasket (6) is configured by its hook end (6d) which abuts on the channel (2d) to create the seal against container outside, and the gasket (6) is further configured to perform a seal adjustment by shifting the hook end (6d) thereon at a minimum, both inwardly and outwardly, according to the air pressure difference between the inside and outside of the container.

A second aspect of this invention is to provide a channel (2d) provided with a downwardly concaved shape in sectional view and extending on the flat portion (2c) along and substantially in parallel with the gasket (6) in full view.

When a plurality of substrate plates requiring precision packaging, such as semiconductor wafers, are stored in a container body, directly or with aid of a cassette, and a container lid is closed and then a lid lock mounted on an upper portion or side wall of the container is applied, a gasket's outward ledge is pressed downward by an outward adjacent surface and deformed; consequently, the end of the ledge's tip will extend to fall in a seal channel, in other words, to abut on a sectionally downward concave, wherein the gasket still keeps its elastic resiliency. As a result, if the pressure difference noted above occurs, the tip end will shift its abutting point, that is, it will move toward a lower pressure area (when the pressure in the container inside is higher than outside, the tip end will move outward). While the tip end moves, a minimum gap between the tip end and the channel surface occurs, and this gap will act as a ventilation route to eliminate the pressure difference.

Other aspects of this invention will become apparent from the following description of embodiments with reference to the accompanying drawings.

DETAILED DESCRIPTION OF THE INVENTION

A precision-packaging substrate container is configured of a container body, a lid, and a gasket (FIG. 1); a gasket-mounting portion is provided around the periphery of the lid (or the); around the periphery of the mouth portion of the container body (or the lid), a planar portion and an arc-shaped seal channel situated outside of the planar portion are provided at the position that faces the gasket-mounting portion when the mouth portion of the container body is closed with the lid.

Meanwhile, the gasket is a looped component that is mounted in the gasket-mounting portion, has a structure in which, from the lower end of the gasket's upper portion, the lateral portion of an outward ledge (in a cross-sectional view) extends outward, a twice-bent portion protrudes from the front end of the lateral portion, and an inward ledge protruding toward the inside of the lid is provided under the gasket's upper portion, and formed of a soft or semi-soft resin such as a fluorine-system resin, an olefin-system resin, or a silicone resin.

In the foregoing gasket, a height difference is provided between the upper surfaces of the inward ledge and the outward ledge's lateral portion; when mounted in the gasket-mounting portion, the gasket is held in a condition in which the upper surface of the outward ledge's lateral portion does not contact the outward adjacent surface of the gasket-mounting portion.

In the configuration described above, when the lid with the gasket mounted therein is fitted into the container mouth portion, the twice-bent portion at the front end of the lateral portion is inserted into the arc-shaped seal channel, whereby the airtightness is maintained.

Embodiment

Figure 1:
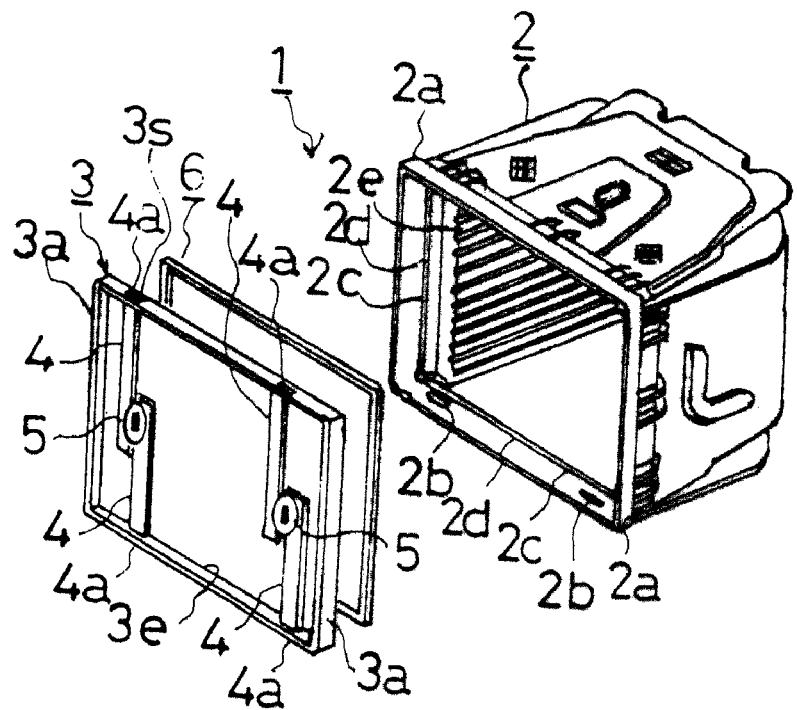
FIG. 1 is a perspective view illustrating the configuration of a precision-packaging substrate container according to the present invention.
Figure 2:
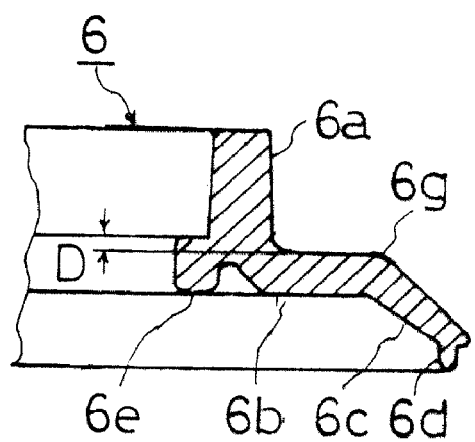
FIG. 2 is a cross-sectional view of a gasket according to the present invention.
Figure 3:
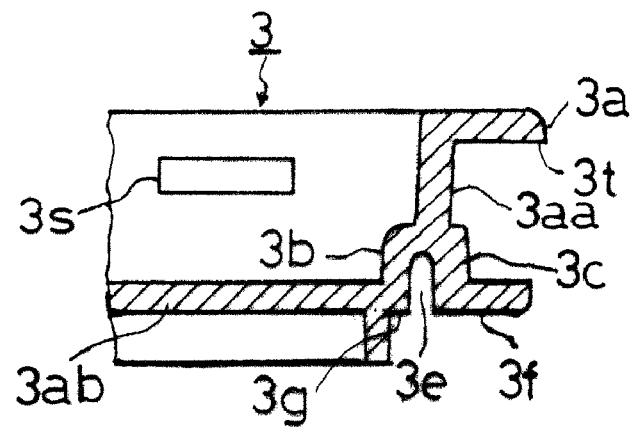
FIG. 3 is a cross-sectional view illustrating another example of the shape of a gasket.
Figure 4:
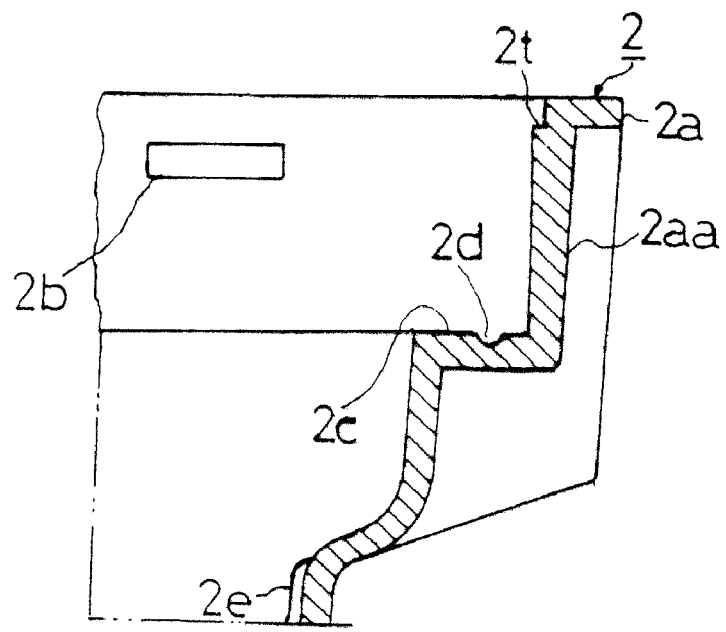
FIG. 4 is a partial cross-sectional view illustrating a container mouth portion in a state in which, after mounting of a gasket on the lid of the container for substrates requiring precision packaging or the like, the container is about to be closed.
Figure 5:
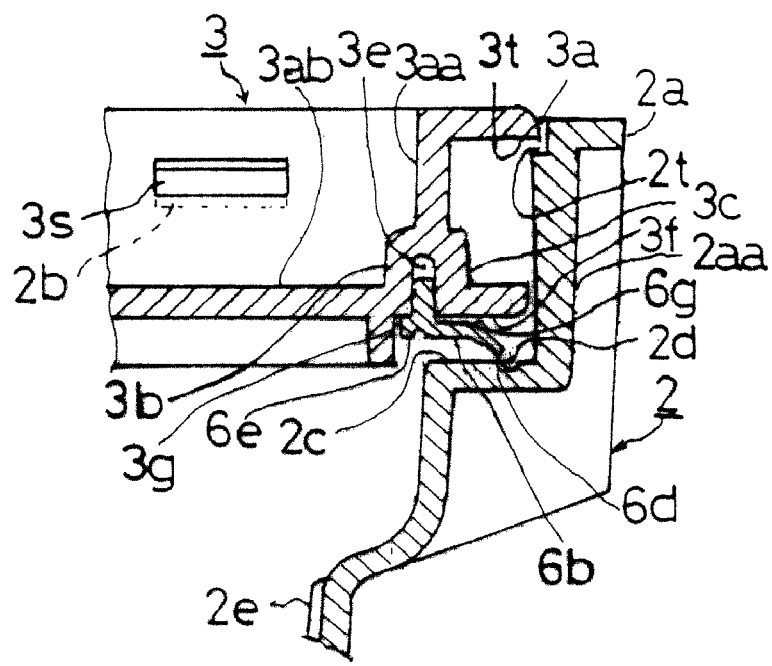
FIG. 5 is a partial cross-sectional view illustrating the container mouth portion in a state in which, in the precision-packaging substrate container in FIG. 4, the container has been closed with the lid.
Figure 6:
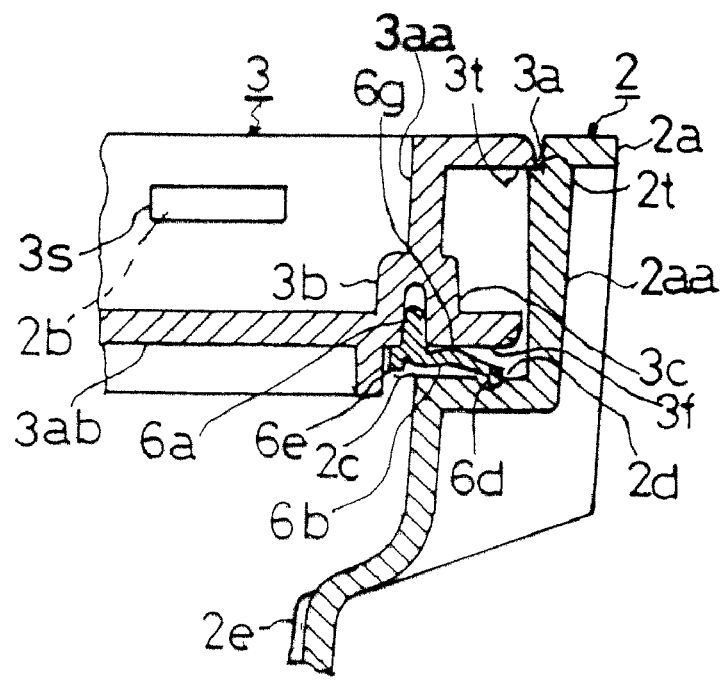
FIG. 6 is a partial cross-sectional view illustrating the container mouth portion in a state in which the container has been closed with the lid on which the gasket in FIG. 3 is mounted.
Figure 7:
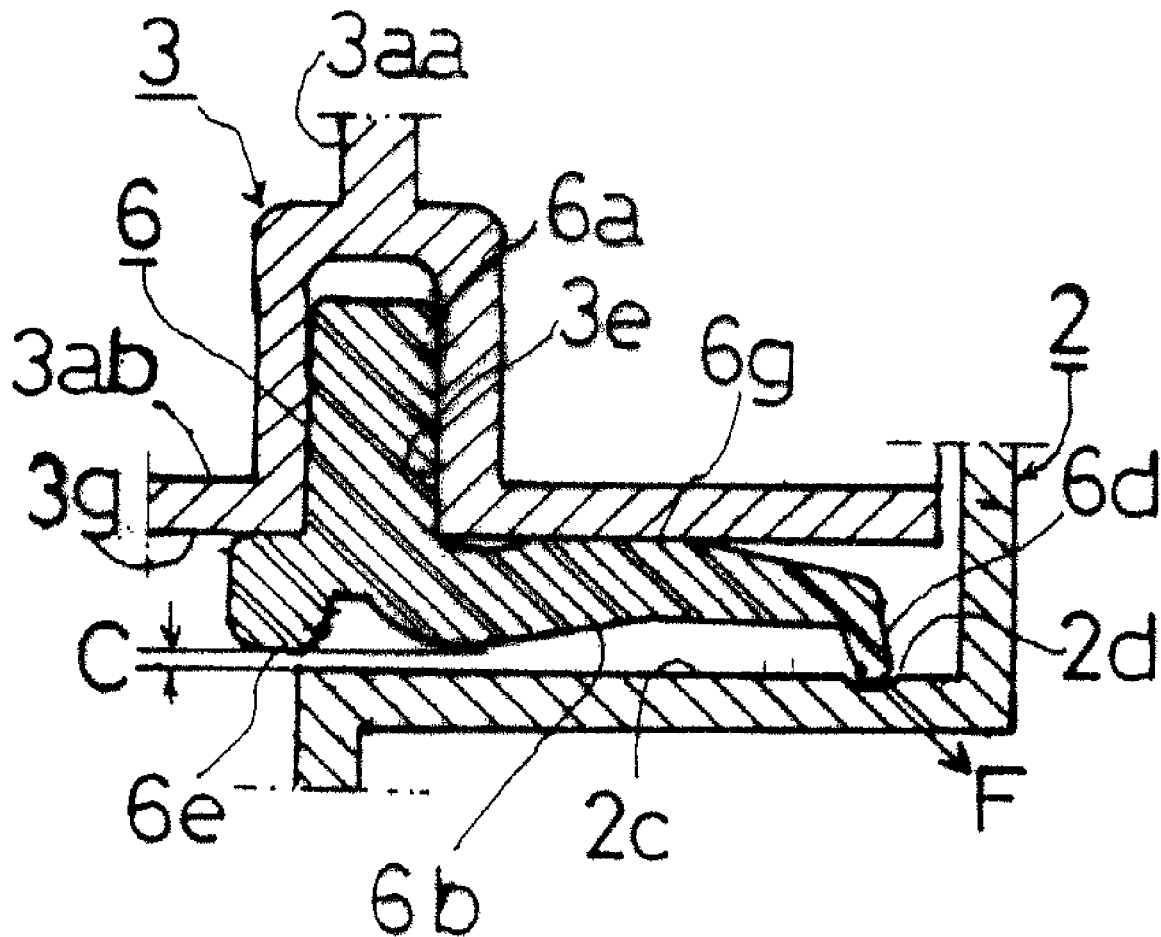
FIG. 7 is a view illustrating an example of a conventional container that addresses deformation due to change in the atmospheric pressure.

An example of an embodiment of the present invention will be described with reference to the drawings; however, the shape of a gasket according to the present invention is not limited to that of the example. FIG. 1 is a perspective view illustrating a precision-packaging substrate container; FIG. 2 is a cross-sectional view of a gasket according to the present invention; FIG. 3 is a partial cross-sectional view illustrating a gasket-mounting concave formed in a lid; FIG. 4 is a partial cross-sectional view illustrating an arc-shaped seal channel into which the tip of a gasket is inserted and that is formed in the periphery of the mouth portion of the container body; FIG. 5 is a partial cross-sectional view illustrating a state in which, after mounting of a gasket in the lid of the body of the precision-packaging substrate container, the container is about to be closed with the lid; FIG. 6 is a partial cross-sectional view illustrating a container mouth portion in a state in which the container body has been closed with the lid; and FIG. 7 is an enlarged view of the front end of the gasket in FIG. 6.

A precision-packaging substrate container 1 is formed mainly of a transparent or a semi-transparent material, such as a polycarbonate, a polypropylene, or the like. A sidewall 3a of a lid 3 is inserted and fitted to the inside of the periphery of a container mouth 2a of a container body 2; an arm 4 provided on the front side of the lid 3 advances in a direction in which the arm linearly extends, while a cam 5 pivots; a wedge-shaped portion 4a formed at the front end of the arm 4 protrudes through a port 3s and is inserted into an engagement hole 2b provided in the container mouth periphery 2a of the container body 2, or the wedge-shaped portion 4a retreats from the engagement hole 2b, so that a structure for locking or unlocking the lid 3 is made. In addition, although not illustrated, a container exists that is configured in such a way that, by providing a hook protruding from the side face of the lid, which provides an engagement protrusion on the container body as the counterpart of the hook, and latching the hook onto the engagement protrusion, the locking function is performed; both of the foregoing types are subject matters of the present invention. Portions of the container mouth periphery 2a of the container body 2 that are vertical walls are designated by Reference Character 2aa.

In a gasket 6 mounted around the fitted portion between the container body 2 of the precision-packaging substrate container 1 and the lid 3, as illustrated in FIG. 2, from the bottom end of the gasket's upper portion 6a, an outward ledge is provided whose lateral portion 6b extends outward and a once-bent portion 6c follows the lateral portion 6b and then is integrally followed by a twice-bent portion 6d that is also named an end portion of the outward ledge. The twice-bent portion (sealing portion) 6d is integrally and downwardly formed; further, in a loop-shaped body in a cross-sectional view, in which, from the base portion, for the lateral portion of the gasket's upper portion 6a, an inward ledge 6e is provided protruding downward; a height difference D between the respective upper surfaces of the inward ledge 6e and the outward ledge's lateral portion 6b is also provided, as illustrated in FIG. 2. In addition, in the present example, the wall thickness of the lateral portion 6b of the outward ledge is set to 2 to 10 mm, and the protrusion length of the gasket's upper portion 6a from the side face is set to 3 to 30 mm. Additionally, the protrusion length and the wall thickness of the twice-bent portion 6d are set in such a way as to be longer than the depth of a seal channel 2d, described later, that has an arc shape in a cross-sectional view and set so as not to be buckled by the lid-closing pressure. The height difference D between the respective upper surfaces of the inward ledge and the outward ledge's lateral portion is set to 1 to 4 mm.

As shown in FIG. 3, lid flange 3a extends downward (3aa) from its top 3a and at the level of a lid plate 3ab, represented by 3f or 3g, the lid wall 3aa is divided into double walls, inner wall 3b and outer wall 3c; in between is formed a looped space having an inverted U shape to accept an upper portion 6a of the gasket 6, wherein FIG. 3 is a sectional view and the two divided walls 3b, 3c, look like vertical ribs. At this configuration, an upper surface of the inward ledge 6e is abutted underneath the surface of an inward adjacent surface 3g, and thereby the degree of insertion of the gasket's upper portion is controlled. In the meantime, a gap D is kept between an outward adjacent surface 3f and a bent point between the flat and once-bent portion of the outward ledge.

With the precision-packaging substrate container 1, according to the present invention, configured as described above, each of the wafers W is contained in such a way that both side edges thereof are inserted into respective slits 2e of the container body 2, the lid 3 with the gasket 6 mounted in the inverted U-shaped upward concave, which engages with the upper portion of the gasket (in sectional view) and takes a loop space to accept the upper portion of the gasket (in full view), covers the container mouth periphery, and the arm 4 is driven by the cam 5 installed in the lid 3, whereby the wedge-shaped portion 4 at the front end of the arm is inserted into the engagement hole 2b of the container body. As a result, the container body 2 and the lid 3 are locked together.

As illustrated in FIG. 5, when the container lid is closed, first the front edge of the twice-bent portion 6d abuts on the gasket abutting area 2c and is thereby upheaved, whereby the bent point 6g between the flat and once-bent portion of the lateral portion of the outward ledge 6b is pressed against the outward adjacent surface 3f of the lid. As the container is further closed, the lateral portion 6b of the outward ledge is depressed, its bending angle is widened, and the lateral portion 6b is extended outward, whereby the twice-bent portion 6d at the front end of the gasket 6 fits into the seal channel 2d (FIG. 6). In this situation, a fitting-portion abutting area 3t of the lid 3 and a fitting-portion abutting area 2t of the container body 2 abut on each other. Furthermore, a slight vertical gap C (FIG. 7) is provided between the lower end of the inward ledge 6e and the gasket abutting area 2c opposing the inward ledge 6e; therefore, they do not contact each other to such an extent that the airtightness can be maintained. Accordingly, in the container 1, compression stress is not directly applied anywhere in the gasket 6. The gasket (6) has an elastic body looping along a periphery of a lid and has a section of a generally two-ledged wall (6a, 6b, 6c) wherein the two ledges include a shorter inward ledge (6e) and an outward ledge (6b, 6c, 6d) with a twice-bent hook. When the gasket has been mounted in place, it extends along the periphery of the lid.

As described above, the contact pressure, created by the twice-bent portion 6d of the gasket 6 according to the present invention, on the seal channel 2d is equal to the resultant force F (FIG. 7) of the bending strength and the outward extending force of the lateral portion 6b of the outward ledge; even with such abutting pressure, the airtightness of the container can be satisfactorily maintained under normal atmospheric pressure.

As described above, when the altitude of an airplane carrying a container sealed in the foregoing way is significantly increased, or when the environmental condition significantly changes, a difference occurs between the inner container air pressure and the atmospheric pressure. In the container on which a gasket according to the present invention is mounted, when, for example, the inner container air pressure becomes larger than that of the atmospheric pressure, the twice-bent portion 6d of the gasket 6 is pushed to the outside (the lower-pressure side) of the container, whereby the twice-bent portion 6d travels in a sliding fashion on the surface of the arc-shaped seal channel 2d. While the twice-bent portion 6d, i.e., the tip of the seal member, travels in a sliding fashion, a microscopic gap occurs between the twice-bent portion 6d and the surface of the arc-shaped seal channel 2d, whereby the inner container gas is discharged; thus, the inner container air pressure and the atmospheric pressure are equalized. In contrast, when the altitude of the airplane significantly decreases and the inner container air pressure becomes lower than that of the atmospheric pressure, the gasket 6 is drawn in by the negative pressure toward the inside of the container, whereby the twice-bent portion 6d slides on the surface of the arc-shaped seal channel 2d and travels toward the inside of the container. As a result, a slight gap occurs between the surface of the arc-shaped seal channel 2d and the twice-bent portion 6d, whereby the atmospheric air flows into the container through the gap. In addition, because the contact pressure by the twice-bent portion 6d, on the arc-shaped seal channel 2d is exerted in the direction indicated by the arrow F (F: the resultant force (FIG. 7)), intake toward the inside of the container is slightly difficult to implement compared with discharge from the inside of the container, and the gap caused by the slide is more microscopic; therefore, particles are not drawn in by the container.

What is claimed is:

1. A container (1) comprising:
   an open-ended (2a) container body (2) formed with a substantially level inner ledge (2c) subjacently bordering the mouth (2a) of the container body, the inner ledge (2c) being recessed with a continuous, cross-sectionally arcuate channel (2d);
   a container lid (3) rimmed with a substantially level plate-like section (3f, 3g) inwardly along which a continuous gasket-anchoring groove (3e) is formed;
   a cartridge section (2e), formed in the container body, for precision packaging a plurality of substrate plates;
   a gasket (6) formed with an anchoring portion (6a) fitted into the gasket-anchoring groove (3e) in the container lid (3), and a ledge portion (6b) extending along the plate-like section (3f) of the container lid (3) and bending (6c, 6d) into a tip formed so as to seat in the arcuate channel (2d) in the inner ledge (2c) of the container body (2) when the container lid (3) is closed onto the container body (2), yet so as to maintain a predetermined gap (C) between the gasket (6) and the inner ledge (2c);
   wherein the gap, the resiliency of the gasket and its bent form, and the shape of the channel are predetermined so that in response to a difference in pressure between the interior and exterior of the container body when the container lid is closed over the container body, the tip slides out of the channel, whereby the seal is momentarily broken, the pressure difference equalizes, and the tip again seats into the channel.

2. A container comprising:

an open-ended container body formed with a substantially level inner ledge subjacently bordering the mouth of the container body, the inner ledge being recessed with a continuous, cross-sectionally arcuate channel;

a container lid rimmed with a substantially level platelike section inwardly along which a continuous gasket-anchoring groove is formed;

a cartridge section, formed in the container body, for precision packaging a plurality of substrate plates;

an elastically resilient gasket (6) formed with an upright anchoring wall (6*a*) fitted into the gasket-anchoring groove in the container lid, a short inward ledge portion (6*e*), and an outward ledge portion (6*b*), longer than the inward ledge portion (6*e* ) but thinner than the inward ledge portion (6*e*) by a predetermined difference (D) between the outward ledge portion (6*b*) and the platelike section, the outward ledge portion (6*b*) extending along the platelike section of the container lid, and midway bending (6*g*, 6*c*) toward the inner ledge of the container body and distally hooking into a tip (6*d*) formed so as to seat in the arcuate channel in the inner ledge when the container lid is closed onto the container body, and to be longer than the depth of the channel so as to maintain a predetermined gap between the gasket (6) and the inner ledge;

wherein the gap, the resiliency of the gasket and its bent and hooked-tip form, and the shape of the channel are predetermined so that in response to a difference in pressure between the interior and exterior of the container body when the container lid is closed over the container body, the tip slides out of the channel, whereby the seal is momentarily broken, the pressure difference equalizes, and the tip again seats into the channel.

3. A container as set forth in claim 2, wherein the difference (D) between the thickness of the inward ledge portion and the outward ledge portion is approximately 1 to 4 mm in practice.

4. A gasket for installation in a container having an open-ended container body formed with a substantially level inner ledge subjacently bordering the mouth of the container body, the inner ledge being recessed with a continuous, cross-sectionally arcuate channel, having a container lid rimmed with a substantially level platelike section inwardly along which a continuous gasket-anchoring groove is formed, and having a cartridge section, formed in the container body, for precision packaging a plurality of substrate plates, the gasket comprising:

an elastically resilient body;

an upright anchoring wall for fitting into the gasket-anchoring groove in the container lid;

a short inward ledge portion;

an outward ledge portion, longer than the inward ledge portion but thinner than the inward ledge portion by a predetermined difference between the outward ledge portion and the platelike section, the outward ledge portion extending along the platelike section of the container lid;

a bent section of the outward ledge portion, bending midway along the outward ledge portion, toward the inner ledge of the container body when the gasket is installed therein; and a tip distally hooking from the bent section, the tip formed so as to seat in the arcuate channel in the inner ledge when the container lid is closed onto the container body, and to be longer than the depth of the channel so as to maintain a predetermined gap between the gasket and the inner ledge;

wherein the gap, the resiliency of the gasket and the form of its bent section and of the tip for seating in the channel are predetermined so that, with the gasket installed in the container, in response to a difference in pressure between the interior and exterior of the container body when the container lid is closed over the container body, the tip slides out of the channel, whereby the seal is momentarily broken, the pressure difference equalizes, and the tip again seats into the channel.

5. A container as set forth in claim 4, wherein the difference (D) between the thickness of the inward ledge portion (6*e*) and the outward ledge portion (6*b*) is approximately 1 to 4 mm in practice.

* * * * *